US012015399B2

(12) United States Patent
Cannon et al.

(10) Patent No.: US 12,015,399 B2
(45) Date of Patent: Jun. 18, 2024

(54) SWITCH DEVICE WITH INTEGRATED TOUCH SENSOR

(71) Applicant: INTERNATIONAL AUTOMOTIVE COMPONENTS GROUP GMBH, Düsseldorf (DE)

(72) Inventors: Carter Scott Cannon, Munich (DE); Aaron Michael Delong, Oxford, MI (US); David M. Pascoe, Aurora (CA)

( * ) Notice: Subject to any disclaimer, the term of this patent is extended or adjusted under 35 U.S.C. 154(b) by 0 days.

(21) Appl. No.: 17/309,442

(22) PCT Filed: Dec. 18, 2020

(86) PCT No.: PCT/US2020/066085
§ 371 (c)(1),
(2) Date: May 27, 2021

(87) PCT Pub. No.: WO2021/133682
PCT Pub. Date: Jul. 1, 2021

(65) Prior Publication Data
US 2022/0407514 A1    Dec. 22, 2022

Related U.S. Application Data

(60) Provisional application No. 62/953,318, filed on Dec. 24, 2019.

(51) Int. Cl.
*H03K 17/96* (2006.01)
*G06F 3/01* (2006.01)
*H03K 17/945* (2006.01)

(52) U.S. Cl.
CPC ......... *H03K 17/9622* (2013.01); *G06F 3/016* (2013.01); *H03K 17/945* (2013.01);
(Continued)

(58) Field of Classification Search
USPC ....................................................... 200/600
See application file for complete search history.

(56) References Cited

U.S. PATENT DOCUMENTS 8,866,750 B2 * 10/2014 Bentsen ............. G06F 3/03549
345/173
10,763,053 B2 * 9/2020 Kosugi ................ H01H 13/52
(Continued)

FOREIGN PATENT DOCUMENTS

DE         102017113660 B3    10/2018

OTHER PUBLICATIONS

International Search Report and Written Opinion of International Application No. PCT/US2020/066085, dated Apr. 13, 2021, 14 pages.
(Continued)

*Primary Examiner* — Daniel C Puentes
(74) *Attorney, Agent, or Firm* — Grossman, Tucker, Perreault & Pfleger PLLC; Steven J. Grossman

(57) ABSTRACT

A multi-value selection switch that includes an engagement surface with an integrated touch sensor. The integrated touch sensor includes a plurality of detectable positions that correspond to, for instance, a range of absolute or relative target input values between a predefined minimum and maximum. The engagement surface further defines a switch that actuates/activates based on detecting a user-supplied force and/ or based on a user momentarily holding a finger/pointer position. A user can select a target input value by bringing a finger or other pointer within operable proximity of an associated detectable position and actuating the switch and/ or momentarily pausing. In response, the selection switch outputs a control signal to an associated device to cause the same to adjust operation.

26 Claims, 8 Drawing Sheets

(52) U.S. Cl.
CPC ....... *H03K 17/962* (2013.01); *H03K 17/9647* (2013.01); *H01H 2300/01* (2013.01)

(56) References Cited

U.S. PATENT DOCUMENTS

| | | |
|---|---|---|
| 2013/0187889 A1 | 7/2013 | Pandher et al. |
| 2016/0077588 A1 | 3/2016 | Adams et al. |
| 2017/0364205 A1* | 12/2017 | Chang .................... H01H 13/83 |
| 2019/0006962 A1 | 1/2019 | Lu et al. |
| 2021/0143818 A1 | 5/2021 | Carvalho et al. |

OTHER PUBLICATIONS

International Preliminary Report on Patentability from corresponding PCT Appln. No. PCT/US2020/066085, dated Jul. 7, 2022.

* cited by examiner

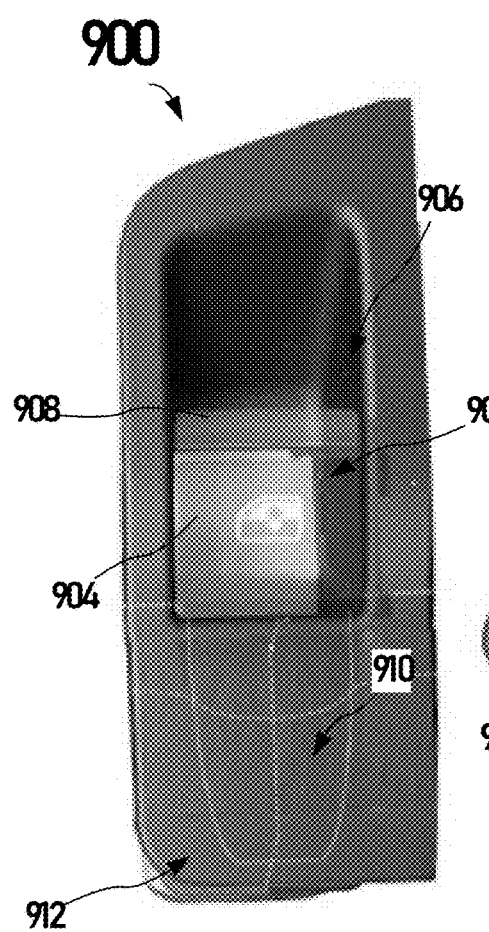
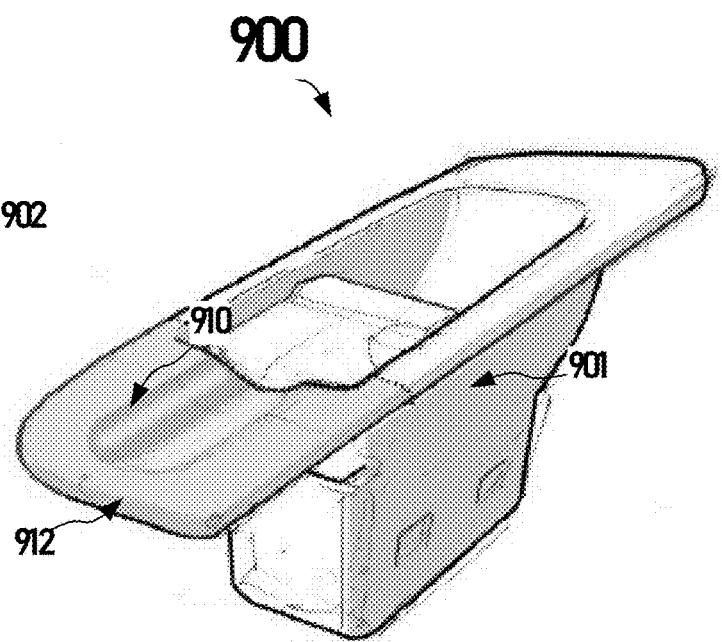
FIG. 9
FIG. 10

SWITCH DEVICE WITH INTEGRATED TOUCH SENSOR

CROSS-REFERENCE TO RELATED APPLICATIONS

This application is a U.S. National Stage (371) of PCT/US2020/066085 filed on Dec. 18, 2020, which claims the benefit of priority to U.S. Provisional Application 62/953,318, entitled "Switch Device with Integrated Touch Sensor" filed on Dec. 24, 2019, which are incorporated by reference herein in their entirety.

TECHNICAL FIELD

This specification relates generally to switch devices, and more particularly, to switch devices that include one or a plurality of touch sensors integrated with mechanical and/or simulated switches, e.g., using haptic feedback, to allow for adjustment and control of vehicle devices and systems.

BACKGROUND INFORMATION

Existing switches within vehicles such as cars offer relatively basic control of devices and systems such as windows, heating & cooling, and media control. Some switches, such as window switches, can be actuated to provide express up or down, but require a user to continue to actuate the switch (e.g., by depressing the switch with a finger) to put the window at a desired position. During operation of a vehicle, such adjustment can result in a driver removing their hand from the steering wheel until the desired window position is achieved.

BRIEF DESCRIPTION OF THE DRAWINGS

The drawings included herewith are for illustrating various examples of articles, methods, and apparatuses of the teachings of the present specification and are not intended to limit the scope of what is taught in any way.

FIG. 9 shows a perspective view of example selection switch in accordance with an embodiment of the present disclosure.

FIG. 10 shows another example selection switch in accordance with an embodiment of the present disclosure.

DETAILED DESCRIPTION

Figure 1:
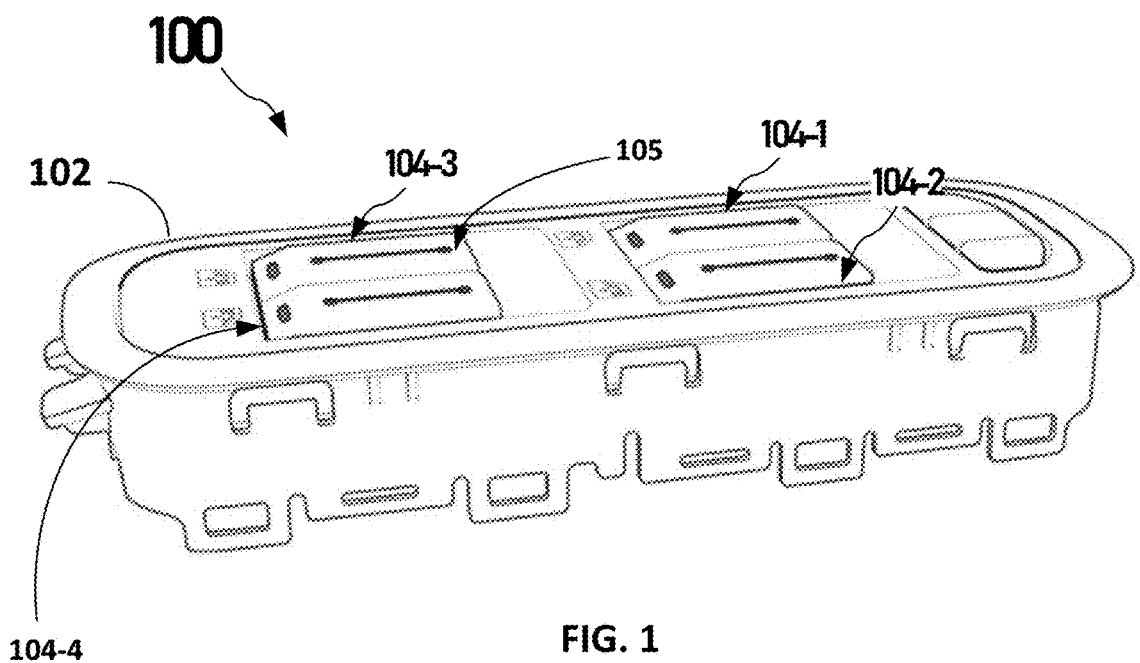
FIG. 1 shows an example switch assembly consistent with embodiments of the present disclosure.

As discussed above, existing switches in vehicles are limited in functionality and can result in a user maintaining prolonged contact to achieve a desired window height, volume change, or moon roof position, for example. Some switches include so-called "express" features whereby a window may be fully-opened or fully-closed by actuation. However, such express features are unable to target an intermediate window position without prolonged user contact.

This disclosure is generally directed to a multi-value selection switch, referred to herein as simply a selection switch, that includes an engagement surface with an integrated touch sensor. The integrated touch sensor includes a plurality of detectable positions that correspond to, for instance, a range of absolute or relative target input values between a predefined minimum and maximum. The engagement surface further defines a switch that actuates/activates based on detecting a user-supplied force and/or based on a user momentarily holding a finger/pointer position. A user can select a target input value by bringing a finger or other pointer within operable proximity of an associated detectable position and actuating the switch and/or momentarily pausing. In response, the selection switch outputs a control signal to an associated device to cause the same to adjust operation.

For example, the target input values of the integrated touch sensor may be associated with a vehicle window being fully open, a target input value of 0, and fully-closed, e.g., a target input value of 100. The user may therefore select or "swipe" to a position that represents a desired input value and actuate the switch. In response, the vehicle window controller receives the control signal and rolls up/down the vehicle window to the desired position based on the target/selected input value, without requiring additional user input/intervention. The selection switch can provide tactile feedback of the actuation based on, for instance, a mechanical rocker switch or haptic vibration. The user is then free to remove their finger(s) from the selection switch, and the window adjustment continues until the selected position is achieved.

One aim of the present disclosure is therefore to provide a selection switch that allows a user to designate a target for the window position and activate/actuate the switch via a momentary touch gesture. Target window height/position is thereby preferably achieved without the necessity of further user interaction, such as maintaining the switch in an actuated position, e.g., by maintaining finger pressure.

Another aim of the present disclosure is to provide a selection switch that comports with applicable standards and regulations. For instance, the Federal Motor Vehicle Safety Standards (MVSS) in C.F.R. § 571.118 Standard No. 118 requires that window switches in cars manufactured on or after Oct. 1, 2010 cause the closing of a power window through vertical or perpendicular "pulling away" by a user. Switches operating in this manner are commonly referred to as pull-to-close switches. Selection switches consistent with the present disclosure can include the above-mentioned user selection features, e.g., target window height/position selection, while also comporting with mandated push-to-close functionality. A user may therefore operate the selection switch in a standard manner, e.g., pull-to-close/push-to-open, without necessarily being aware of additional features and operations of the selection switch.

A selection switch consistent with the present disclosure preferably mechanically actuates or gives the user feedback that the switch has been activated, e.g., through vibration or other haptic feedback. Selection switches consistent with the following disclosure can include gesture recognition that can achieve target value selection via, for instance, swiping/ sliding and other predefined gestures. Selection switches consistent with the present disclosure can include a predefined set of points that extend across the same, e.g., at least three equally-spaced points, or can include a plurality of positions along an infinite scale of incrementing values. Further, logical and/or algorithmic approaches can be implemented that associate each position with an input value, and this disclosure is not necessarily limited to defining static positions that incrementally/monotonically increase. Selection switches consistent with the present disclosure preferably include an engagement surface that is capable of detecting proximity, pressure, and/or touch (e.g., via capacitive and/or resistive sensing).

The following scenarios and examples include detecting position of a user's fingers/thumb for selection purposes. However, other indicating objects may be detected by selection switches disclosed herein, e.g., such as a stylus. A user pointer generally refers herein to any device, including one or more fingers and/or indicating objects, whose position/proximity can be detected and quantified independent of other positions along the switch.

Turning to the Figures, FIG. 1 shows an example switch assembly 100 suitable for use in a wide range of sea, land and air-based vehicles such as automobiles, busses, trucks, planes, boats, and trains. Note that while the following examples and scenarios specifically reference control and adjustment of window position within the context of an automobile, this disclosure is not limited in this regard. Switching devices consistent with the present disclosure can be utilized to adjustably control a wide range of devices and systems including, for example, multi-media/infotainment systems (e.g., volume up/down, next track, pause), and environmental systems (e.g., HVAC such as heating and AC).

Continuing on, the switch assembly 100 includes a housing 102 preferably formed of a plastic or other suitably rigid material. The housing 102 includes an upper surface with one or more openings (not shown) to allow for switches and/or other user-input devices to extend therethrough and mount flat, e.g., coplanar, and/or above the upper surface, e.g., such as shown in FIG. 1. For example, the embodiment of FIG. 1 includes selection switches 104-1 to 104-4, also referred to herein as switches. Preferably, each selection switch 104-1 to 104-4 includes a body that defines an engagement surface 105 for receiving user input, and includes a section below the engagement surface for associated mechanical and/or electrical components, as will be discussed in additional detail below.

In the embodiment of FIG. 1, selection switches 104-1 and 104-2 correspond with driver and front-side passenger windows, respectively, of an automobile. Likewise, selection switches 104-3 and 104-4 correspond with left/right rear passenger windows. The switch assembly 100 can be disposed in, for instance, a driver-side arm rest to allow for the driver to easily and conveniently adjust window position for any of the aforementioned windows. The switch assembly 100 preferably further provides window locking functions to prevent other occupants, e.g., children, from adjusting window position.

In operation, the user targets a specific window for adjustment by bringing one or more fingers in operable proximity with one or more of the selection switches 104-1 to 104-4. Operable proximity, as generally used herein, refers to a location relative to a touch sensor that allows for the presence of a user pointer to be detected. Operable proximity is not necessarily limited to direct contact, and instead refers to any position on or near a touch sensor at which a user pointer can be detected.

Preferably, the selection switches 104-1 to 104-4 are configured to engage one or more primary, secondary, and/or tertiary functions. The primary, secondary and tertiary functions/modes may be engaged via one or more predefined gestures (or sequence of gestures), as will be discussed in greater detail below.

Primary functions as generally disclosed herein include functions that are traditionally associated with a selection switch based on the position and configuration of the same. For instance, selection switches 104-1 to 104-4 being located within a driver side door have a primary and well understood purpose/function of adjusting window position (e.g., up/down). Each selection switch 104-1 to 104-4 can include associated circuitry that allows each to receive and detect a gesture to adjust a corresponding device/system, as will be discussed below with reference to FIG. 3. In addition, the selection switches 104-1 to 104-4 can include circuitry that allows for predefined gestures to be detected by two or more switches at substantially the same instance in time. Such multi-switch gestures may be used to adjust two or more windows simultaneously, for example, or to cause other predefined secondary and/or tertiary functions to occur.

Preferably, secondary functions allow for control/adjustment of a primary function, and may be utilized to augment/adjust a primary function desired by a user. For instance, secondary functions of the selection switches 104-1 to 104-4 can include detecting a predefined gesture that establishes a target position for the window prior to executing a predefined gesture that causes the primary function, e.g., the window moving to that target position.

Preferably, tertiary functions of the switches 104-1 to 104-4 allow for adjustment of systems/devices not necessarily related to the systems/devices adjusted by primary/secondary functions. For example, the selection switches 104-1 to 104-4 can support a predefined gesture to transition to a mode that adjusts left/right mirrors, the rear-view mirror, cameras disposed around the automobile, and so on. Other example tertiary functions include adjustment of sun/moon roofs, window privacy screens, and door locking/unlocking routines. For example, the selection switches 104-1 to 104-4 may be configured to detect a predefined gesture that occurs at substantially the same moment in time on two or more selection switches, e.g., a user swiping their thumb and index finger across the first and second selection switches, respectively, immediately followed by the third and fourth selection switches, respectively. In this example, the selection switches 104-1 to 104-4, and more specifically an associated controller, can detect this swipe-gesture, and in response thereto, lock or unlock all doors. Likewise, swiping across a single selection switch, or a number less than all, may be utilized to lock specific/target doors.

Figure 2A:
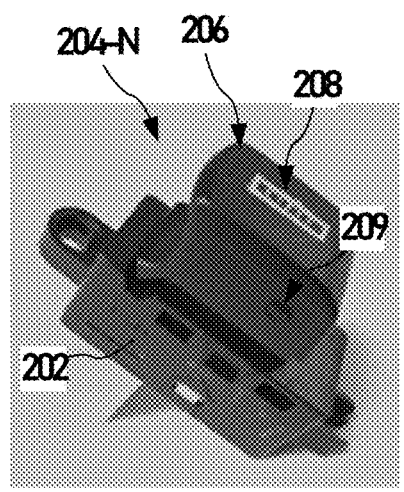
FIG. 2A shows an example selection switch consistent with an embodiment of the present disclosure.

Turning to FIG. 2A, one example selection switch 204-N consistent with an embodiment of the present disclosure is shown. The selection switch 204-N may be utilized in the switch assembly 100 as any one of selection switches 104-1 to 104-4. As shown, the selection switch 204-N includes a body 202 that defines an engagement surface 206. In an embodiment, the body 202 and the engagement surface 206 comprise a rocker switch based on pivot 209 that allows for a user to supply a relatively small amount of force to allow for the engagement surface 206 to mechanically depress and activate a primary operation, e.g., roll up or down the associated window. Alternatively, the engagement surface 206 and body 202 include an associated sensor, e.g., a pressure sensor, proximity sensor, or other suitable sensor such as a capacitive touch sensor, that can detect contact with a user, e.g., a finger press. In this example, the engagement surface 206 does not necessarily mechanically depress, and instead the sensor can detect that the user is "pressing" the same. The selection switch 204-N may then respond to the user input with haptic feedback, a visual indicator (e.g., an LED), audible sound (e.g., a beep), or any combination thereof.

Figure 2B:
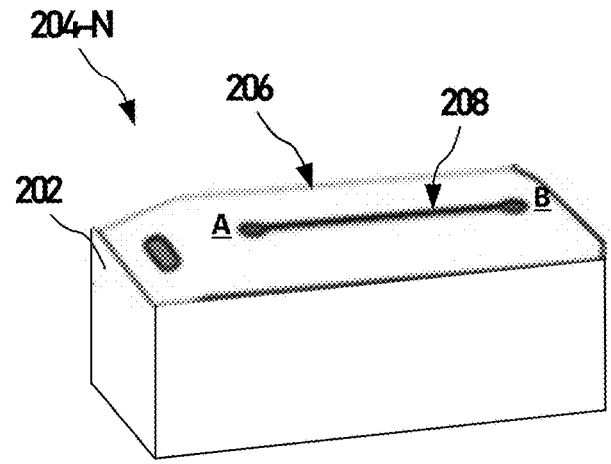
FIG. 2B shows another example selection switch consistent with an embodiment of the present disclosure.

FIG. 2B shows another example selection switch 204-N' implemented as an electrical switch. The example selection switch 204-N' may be implemented substantially similar to that of the selection switch 204-N, and for this reason the description of which will not be repeated for brevity. The selection switch 204-N' can be implemented as a mechanical rocker switch, e.g., such as shown in FIG. 2A, or as simply a touch-sensitive switch without mechanical actuation.

Continuing on, the engagement surface 206 further defines at least one integrated user input device, which may also be referred to herein as a touch input sensor or simply a touch sensor. For example, the switch 204-N' includes a touch input sensor 208. The touch input sensor 208 preferably detects the position of the finger of the user between first and second ends of the same, labeled in FIG. 2B generally as point A and B. The relative position between points A and B may then be converted to a desired window position. The output of touch input sensor 208 may be analog, or digital, depending on a desired configuration.

For example, consider a scenario where the user desires to roll up the window. In this scenario, the user presses or swipes their finger on the touch input sensor 208 such that the same pauses for a predefined amount of time at position B, e.g., the furthest detectable position from position A. In response to this gesture, the selection switch 204-N outputs a signal to cause the window to roll up (e.g., full). Alternatively, or in addition, a user may simply apply additional force at position B to cause the engagement surface to register a "press", e.g., via a mechanical rocker switch or electrical/optical sensor, and then cause the window to roll up to the desired position.

Likewise, a user may swipe and/or press at other locations between A and B to cause the associated window to roll up or down to a target location. Position A may be associated with fully rolled down, and the midpoint may be associated with half-way. The touch input sensor 208 can provide N number of such positions between A and B. Still further, a user may use similar gestures to, in a general sense, "interrupt" movement of the window to stop the executed movement or select a different position for the window to move towards, for example.

Still further, additional touch-sensitive regions may be disposed near the touch input sensor 208 (not shown). In this example, each touch-sensitive region can include an associated icon that indicates a corresponding function. Some such icons could include a picture/graphic of a window, a door, and a moon roof. A user may then use a finger to select the touch-sensitive region that corresponds with a target function by simply "pressing" an icon. This selection can result in the selection switch changing primary operation to target the desired function/device, and preferably allow for fine-grain selection/adjustment via touch input sensor 208. For example, a user may select/activate a door icon along engagement surface 206 by touching the same, followed by a swiping gesture along touch input sensor 208 to lock/unlock a vehicle door. Accordingly, each selection switch may be associated with a plurality of primary devices/systems, and a user can adjust the target device/system by simply selecting a corresponding icon/visual indicator.

In any event, and in one specific non-limiting example embodiment, a selection switch consistent with the present disclosure allows for a user to execute a pre-defined gesture (or a sequence thereof) that both targets a desired window position and causes actuation of the window motor(s) to reach the desired position.

Figure 3:
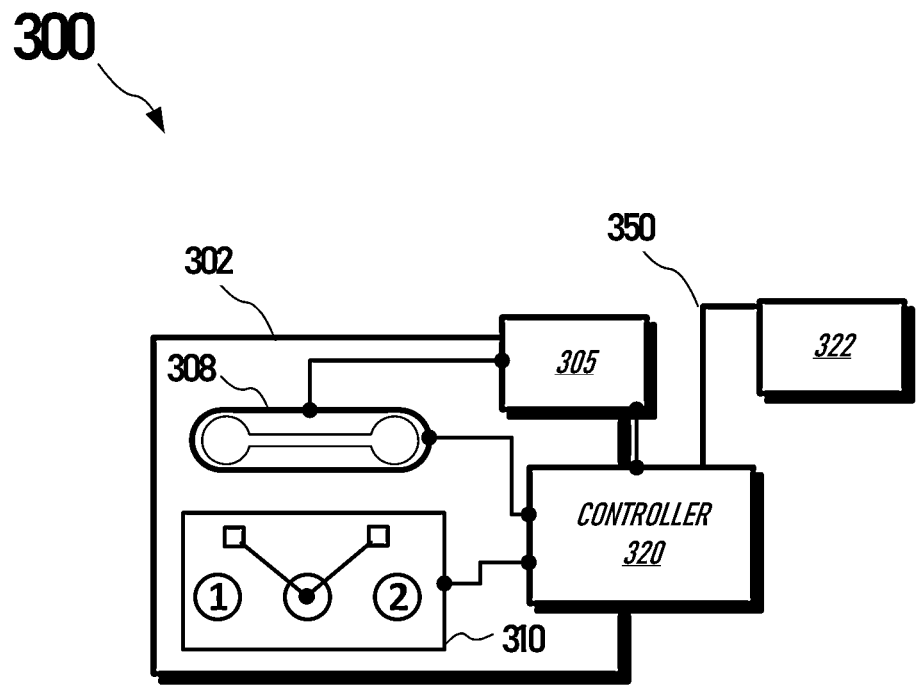
FIG. 3 shows a block diagram of an example switching circuit in accordance with an embodiment.

FIG. 3 shows a block diagram of an example switching circuit 300 in accordance with an embodiment. The switching circuit 300 is suitable for use within the selection switches 104-1 to 104-4, and 204-N discussed above.

The switching circuit 300 includes a plurality of components within a body 302 of a selection switch, although one or more components may not necessarily reside locally within a selection switch depending on a desired configuration. The switching circuit 300 preferably includes a touch input sensor 308, an optional haptic feedback device 305, a mechanical rocker switch 310, and a controller 320.

The touch input sensor 308 comprises, for example, one or more resistive and/or capacitive sensors. In one preferred example, the touch input sensor 308 can include an array of capacitive and/or resistive input sensors. Alternatively, or in addition, the touch input sensor 308 can include a touch screen device capable of translating user input to a location, e.g., via Cartesian coordinates. The touch input sensor 308 can output a plurality of locations/coordinates in a sequence over a period of time T based on, for instance, user swiping their finger across the same. The touch input sensor 308 may comprise other devices such as, for instance, a proximity sensor, or one or more layers of conductive inks to provide an inmold circuit, or any other device capable of detecting and translating user input into an absolute or relative position.

The touch input sensor 308 may further preferably includes a dedicated controller (not shown) that can receive touch input data and compare the same to predefined gestures, e.g., in a memory, to detect a desired operation. As discussed above within the context of FIGS. 1 and 2A-2B, the touch input sensor 308 can comprise a touch screen that extends linearly between two points, e.g., A and B, where a detected position of a user's fingers can be translated to a target window position, for example. The touch input sensor 308 may also visually display the selected position by, for instance, a backlit display that is integrated into the touch input sensor 308, although other techniques for providing visual indications of a selection are within the scope of this disclosure.

The optional haptic feedback device 305 comprises any device capable of providing tactile feedback to user in the form of a vibration, for example. Alternatively, or in addition, audible tones, visual indicators and other such approaches may be used to provide feedback in response to presses and/or gestures.

The mechanical rocker switch 310 can comprise any device suitable for allowing a user force to be translated into an electrical signal. The mechanical rocker switch 310 may be configured to select between two positions and return to a normally-open position in the absence of a user force. However, other types of switches are equally suitable including single-position rocker switches. Note, the mechanical rocker switch 310 may be replaced by an "electrical" switch that detects user input using capacitive sensing, proximity, or resistive sensing. Continuing on, the engagement surface of a switch, e.g., engagement surface 206 of FIGS. 2A/2B, may form at least a portion of the mechanical rocker switch 310.

The example switching circuit 300 further preferably includes a controller 320 electrically coupled to the touch input sensor 308 and/or the mechanical rocker switch 310. The controller 320 may further electrically couple to the optional haptic feedback device 305. The controller 320 may comprise circuitry, logic, and/or chip(s) to receive signals output from the components of the example switching circuit 300. The controller 320 may then utilize the output signals to detect a gesture, for instance, based on a signal from the touch input sensor 308 that includes a representation of one or more detected coordinates/locations. Likewise, the controller 320 may utilize output from the mechanical rocker switch 310 to initiate primary/second functions/modes, as discussed above, although the mechanical rocker switch 310 is not intended to be limiting. Indeed, the mechanical rocker switch 310 may be omitted entirely, or replaced by other switching devices.

In any such cases, the controller 320 preferably utilizes output signals from the example switching circuit 300 to initiate a desired primary, secondary and/or tertiary function/mode. As shown in FIG. 3, device 322 may be implemented as a window controller that includes a motor and associated circuitry to roll up/down one or more windows. In this example, the controller 320 sends a control signal 350 to the device 322 to cause the same to adjust window position, and preferably, to a target position that was set/selected based on the user interacting with the touch input sensor 308. The controller 320 may be electrically coupled to a plurality of devices, e.g., based on a data bus, and is not limited to a single device, e.g., device 322. Likewise, the controller 320 may be configured to receive input from a plurality of selection switches, switches 104-1 to 104-4 (see FIG. 1), and perform primary, secondary and tertiary functions against a plurality of associated devices.

Figure 4:
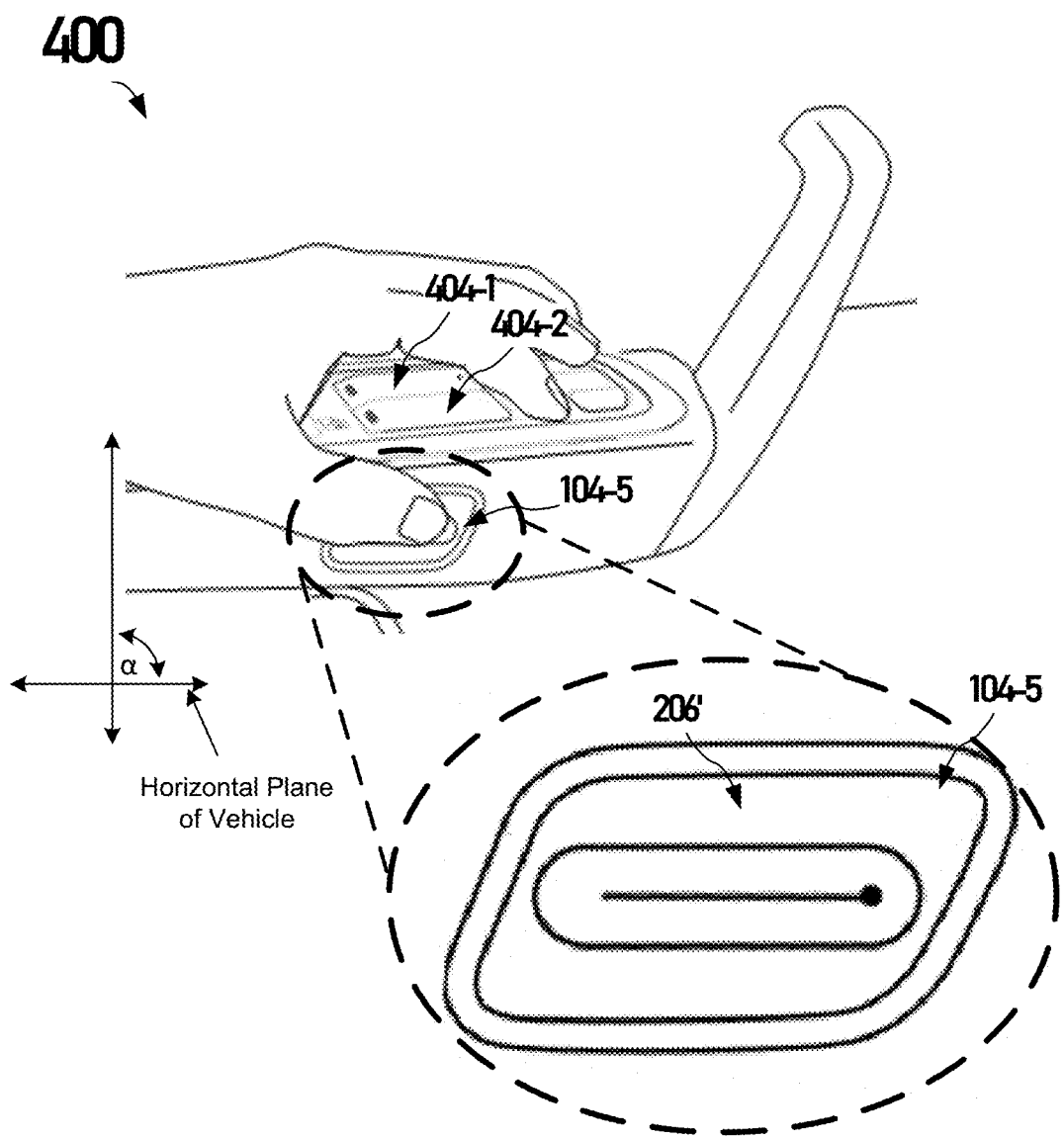
FIG. 4 shows an example of a switch arrangement within a vehicle, in accordance with an embodiment.

FIG. 4 shows an example embodiment 400 consistent with the present disclosure. As shown, a selection switch 104-5 consistent with the present disclosure is disposed proximate the selection switches 104-1 to 104-4 such that a user can engage the selection switch 104-5 with, for instance, their thumb while other fingers manipulate/engage selection switches 404-1 to 404-2. The selection switch 104-5 may be configured substantially similar to that of the switches 104-1 to 104-4 discussed above, the description and features of which are equally applicable to switch 104-5 and will not be repeated for brevity.

However, as shown in FIG. 4, the switch 104-5 is preferably disposed in an orientation where it does not present a relatively planar horizontal surface within the vehicle, which can be susceptible to inadvertent activation. For example, a switch with a relatively planar horizontal engagement surface in the vehicle may be inadvertently activated by any unintended downward force, which could be provided, e.g., by a child or an animal. Accordingly, the switch 104-5 including touch-input sensors is preferably positioned in the vehicle such that the engagement surface of said switch is disposed at an angle α of 90°+/−30° with respect to the horizontal plane of the vehicle. Preferably, the engagement surface 206' extends substantially transverse relative to the engagement surfaces of selection switches 404-1 and 404-2. Selection switch 104-5 therefore preferably allows for a user's hand to remain in a relatively normal posture/orientation. The selection switch 104-5 may then be utilized to, for instance, cause a primary, secondary and/or tertiary function to occur/execute. In this scenario, the selection switches 404-1, 404-2 may not necessarily include selection capabilities via touch sensors as disclosed herein, and instead may be simply implemented as standard switches that can be used to activate a selection made by a user via selection switch 104-5.

For instance, consider a scenario where a user desires that a window be rolled up to leave only a small sliver of an opening for air flow. In this scenario, the user can interact with selection switch 104-5 to swipe or otherwise select a target position with their thumb. The user may then "apply" this change by applying pressure or otherwise activating selection switch 104-1 and/or switch 104-2.

Figure 5:
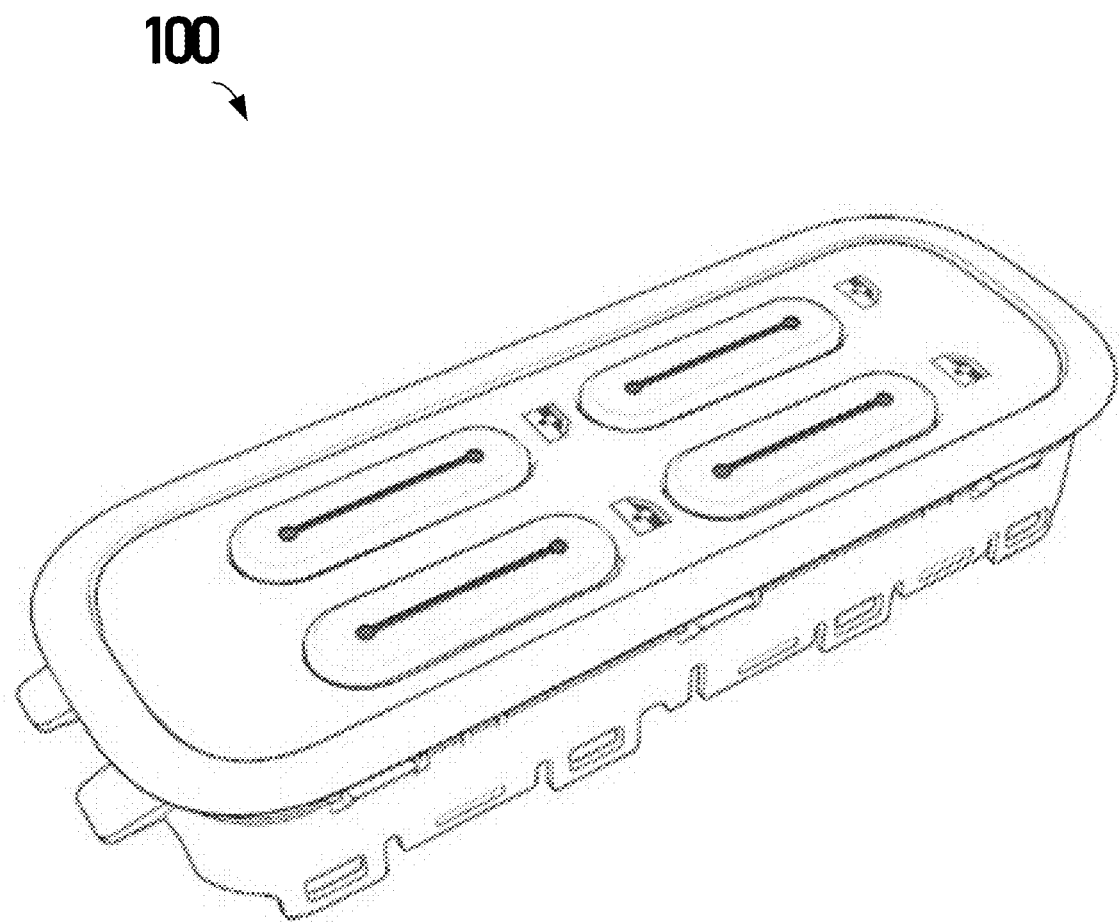
FIG. 5 shows another example switch assembly consistent with an embodiment of the present disclosure.

FIG. 5 shows another example of a switch assembly having "fixed" selection switches consistent with the present disclosure. In this example, each selection switch includes a pressure sensor or other sensor capable of measuring and converting a user-supplied force into a proportional electrical signal. In this embodiment, the selection switches preferably include an associated haptic feedback device to provide tactile indication of switch activation/actuation.

Figure 6:
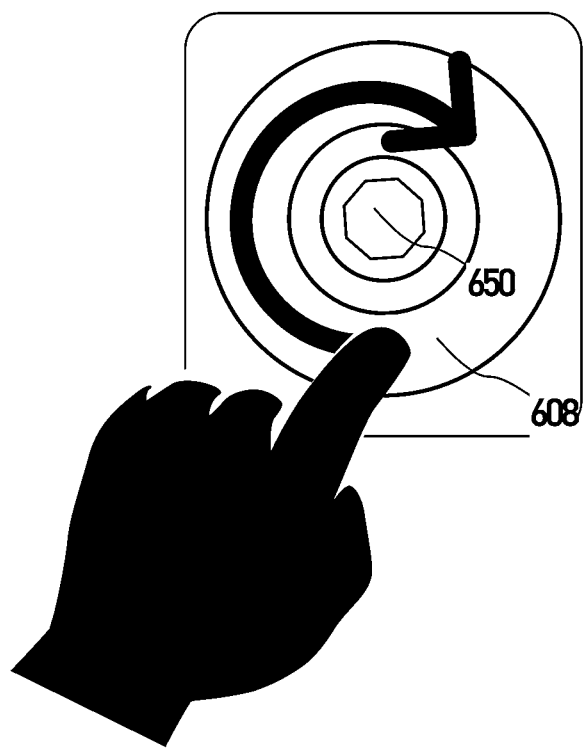
FIG. 6 shows an example selection switch in accordance with an embodiment of the present disclosure.

FIG. 6 shows another example embodiment of a selection switch 600 consistent with the present disclosure. In this embodiment, the engagement surface of the selection switch 600 includes a touch input sensor 608 that includes a substantially circular profile. The selection switch 600 can further include an optional center switch 650 for activating/actuating the same or interrupting a previous actuation, e.g., to stop a window from further travel/movement.

The selection switches 104-1 to 104-4 of FIG. 1 can include this circular engagement profile rather than (or alternatively in combination with) the relatively 'linear' touch input sensor discussed above.

In an embodiment, the selection switch 600 may also be implemented as a so-called "stand-alone" switch that is separate and distinct from the selection switches 104-1 to 104-4 and be utilized to, for instance, "unlock" the gesture recognition capabilities of selection switches 104-1 to 104-4 discussed above based on a user swiping their finger along touch input sensor 608 as shown in FIG. 6. In this example, a user may then swipe a finger in a clockwise or counter clockwise fashion to "unlock" one or more other selection switches. Optionally, the user can complete the unlock operation by selecting/pressing the center switch 650 after performing the clockwise/counter-clockwise gesture. The unlock may then allow for the user to perform one or more gestures as discussed above to initiate primary, secondary and/or tertiary functions on associated devices via, for instance, selection switches 104-1 to 104-4.

Alternatively, or in addition to using the selection switch 600 as an unlock switch, a user may also utilize the circular touch input sensor 608 to select a target value when executing primary, secondary and/or tertiary functions/modes. For instance, the user may perform a clock-wise swipe along touch input sensor 608 to increase volume of media being played by an infotainment system. The clock-wise swipe may increase volume in a relative fashion whereby a circular motion that traverses about 25% of the touch input sensor 608 increases volume by 25%. On the other hand, a counter-clockwise swipe along the touch input sensor 608 could reduce volume of media playing through an infotainment system, and preferably, by an amount proportional to the distance of the swipe along touch input sensor 608.

Figures 7, 8:
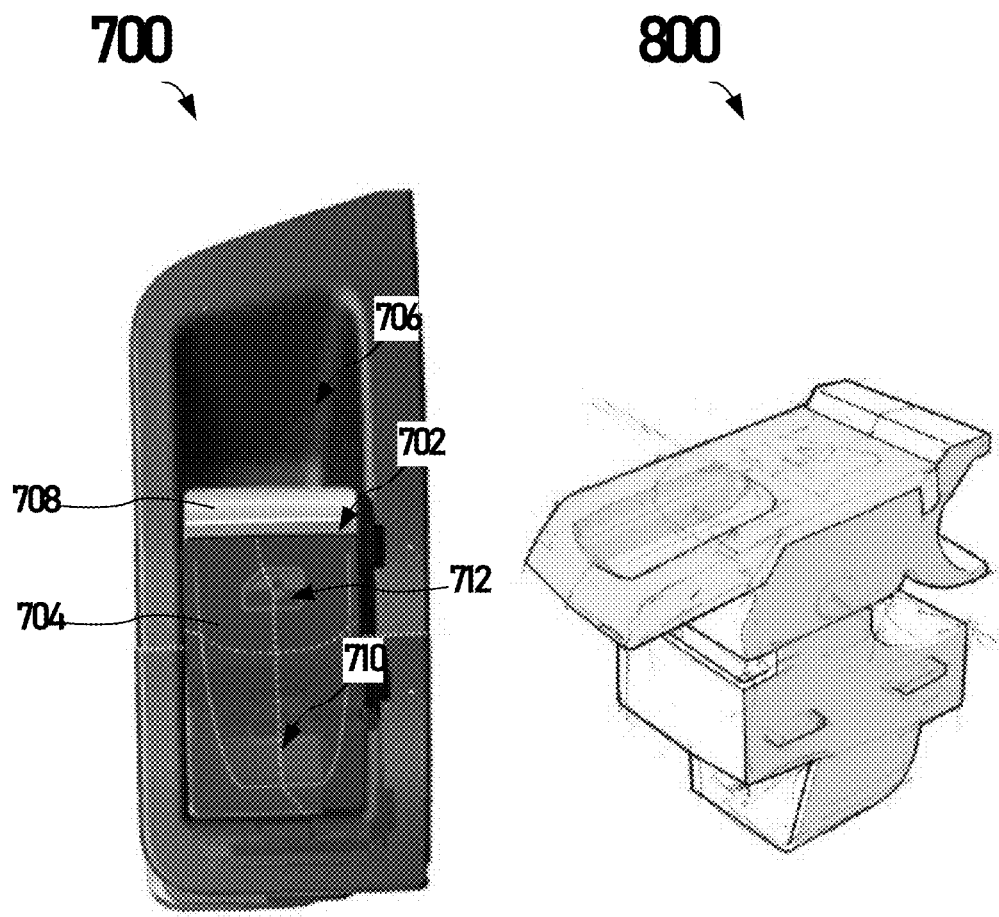
FIG. 7 shows another example selection switch in accordance with an embodiment of the present disclosure.
FIG. 8 shows a perspective view of the selection switch of FIG. 7 in accordance with an embodiment.

FIG. 7 shows another example embodiment of a selection switch 700 consistent with the present disclosure. The selection switch 700 can implement the switching circuit 300 of FIG. 3, for example, and is preferably configured to execute various primary, secondary and tertiary device control functions as variously disclosed herein.

As shown, the selection switch 700 includes a single rocker switch configuration. In this configuration a user can pull up or push-down on rocker switch 702, and more particularly, by supplying pressure on a finger-grip portion 708 of engagement surface 704 that is disposed at a midpoint of finger well/slot 706.

As further shown, the selection switch 700 includes a touch sensor 710 integrated into the engagement surface 704. Thus, a user can activate/actuate the selection switch 700 via "analog" rocker operation, e.g., by pushing or pulling up on the finger-grip portion 708. In addition, the user can perform selection of a target value (e.g., a particular window position) via a finger swipe or other similar gestures, e.g., taps, along the touch sensor 710. The selection switch 700 preferably further includes a backlit graphical indicator 712. The backlit graphical indicator 712 can further include a visual depiction that corresponds with a selection via the touch sensor 710. For example, selecting a half-way point by swiping along the touch sensor 710 to a midpoint of the same can result in the graphical indicator 712 showing an animation (or still image) of a window rolling up half-way, or down half-way as the case may be. FIG. 8 shows a perspective view 800 of the selection switch 700 in accordance with an embodiment.

FIG. 9 shows another example embodiment of a selection switch 900 consistent with the present disclosure. The selection switch 900 can implement the switching circuit 300 of FIG. 3, for example, and is preferably configured to execute various primary, secondary and/or tertiary device control functions as variously disclosed herein.

As shown, the selection switch 900 includes a single rocker switch configuration. In this configuration a user can pull up or push-down on rocker switch 902, and more particularly, by supplying pressure on a finger-grip portion 908 of engagement surface 904 that is disposed at a midpoint of finger well/slot 906.

As further shown, the selection switch 900 preferably includes a touch sensor 910 integrated into the body 901, which is shown more clearly in FIG. 10. The touch sensor 910 may be integrally formed with the body 901, and preferably, an outer surface of the body 901 that provides a bezel 912. The bezel 912 can include a shape/profile that appears to be simply an outer frame of the selection switch 900. However, the bezel 912 can include a touch sensor 910 to support user selection features as various disclosed herein. Accordingly, the switch herein is preferably such that one can locate the touch sensor on the bezel and one can manufacture the switch system herein modularly with or without the touch sensor.

Thus, a user can activate/actuate the selection switch 900 via "analog" rocker operation, e.g., by pushing or pulling up on the finger-grip portion 908. In addition, the user can perform selection via a finger swipe or other similar gestures, e.g., taps, along the touch sensor 910. In this embodiment, the touch sensor 910 is fixed to the bezel 912, thus allowing for user selections to be activated by subsequently actuating the analog rocker provided by selection switch 900. The touch sensor 910 can include an optional backlight. The touch sensor 910 can be implemented with a concave profile, such as shown in FIG. 10, which increases user comfort by contouring to a finger/pointer device.

Figure 11:
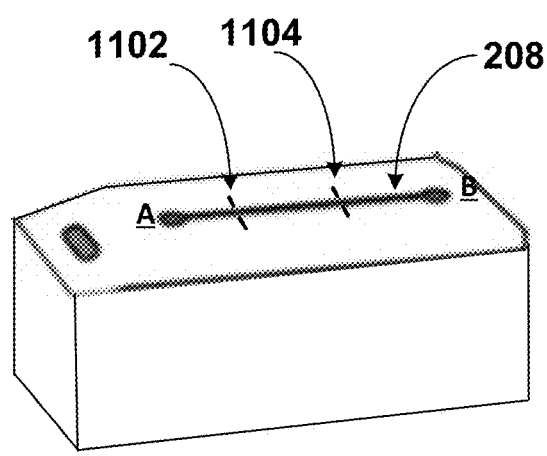
FIG. 11 shows an additional embodiment of the switch assembly including a selection switch.

An additional embodiment is next illustrated in FIG. 11. The switch assembly as now presented again includes a selection switch 104-1 as described herein with an engagement surface and a touch input sensor 208. The switch also now preferably includes one or more physical features 1102 that a user can detect which alert the user to a general setting and positioning of the touch sensor 208. Physical feature 1102 may therefore comprise a raised projection on the engagement surface or a depression on the engagement surface.

By way of example, with respect to physical feature 1102, which as illustrated in FIG. 11 is preferably a raised feature relative to the touch sensor, such as a rib feature, such would indicate to the user that if they set the touch sensor to the approximate location of physical feature 1102, and in the case of managing window operation, the window would then be set to about a 33% closed position. Physical feature 1104 would next indicate that if the touch sensor is set to this approximate location, the window would be set to about a 66% closed position. Accordingly, it is contemplated that one or more physical features can be preferably included on or in the engagement surface of the switch herein, to provide what may be described as a tactile guide to the approximate position of the window in the vehicle, when the touch input sensor is set to a location on the engagement surface that corresponds to the location of the one or more physical features. In this manner, a user, such as the vehicle driver, can now set a particular desired opening for a selected window in the vehicle, without having to visually look at the switch, which therefore can improve the safe operation of the vehicle, as the driver can maintain all eyes outside on the road while setting a window to a particular desired range of opening or closing.

Additional Embodiments and Architecture

Selection switches disclosed herein can utilize standard switch bodies and a simple rocker style switch that is utilized in many vehicle applications. Circuitry, e.g., example switch circuit 300 of FIG. 3, preferably gets disposed into a cavity provided by the body of a selection switch consistent with the present disclosure. Indicator strips/lines are preferably disposed on the selection switch to visually indicate selectable positions. One or more controllers can receive and interpret user input via the selection switches and output control signals to, for instance, motion control hardware and software systems.

Selection switches consistent with the present disclosure can include a touch sensor region with an optional switch for actuation. A secondary switch can be associated with a selection switch to allow for actuation. Accordingly, conventional switches such as window control switches can be implemented and a selection switch can be disposed in a thumb-accessible location to allow for selection of a specific window position, followed by switch activation via the standard window switches.

One aim of the present disclosure is to allow for visual indicators to be implemented within or adjacent selection switches. The visual indicators can include, for example, LEDs or other suitable lamps. The selection switches may energize the visual indicators when, for instance, a user pointer is detectable within operable proximity. The visual indicators may continue to be energized for a predefined period of time T after the absence of a user pointer is detected. This advantageously provides a lighting scheme whereby buttons remain relatively hidden/unlit until a user seeks to operate the same.

In accordance with an aspect of the present disclosure a switch device is disclosed. The switch device comprising an engagement surface with a touch sensor to detect a pointer of a user within operable proximity, the touch sensor defining a plurality of detectable locations that extend across the engagement surface, a switch defined by the engagement surface, the switch configured to detect force supplied by a user and actuate the switch device, and a controller to receive a signal from the touch sensor that includes a representation of one or more of the plurality of detectable locations based on the pointer of the user being detected proximate thereto, and in response to actuation of the switch, output a control signal based on the representation of one or more detectable locations.

In accordance with an aspect of the present disclosure a switch assembly for use in a vehicle to control operation one or more vehicle devices is disclosed. The switch assembly comprising a first switch comprising an engagement surface for receiving user input, a touch sensor disposed on the engagement surface having a plurality of locations to detect user input, each location of the plurality of locations corresponding to a different target value within a range of predefined minimum and maximum target values, a switch device coupled to the engagement surface, the switch device to detect a user-supplied force and cause the first switch to output a signal in response thereto, the signal including a representation of a selected value, the selected value being between the minimum and maximum target values based on a detected position of the user input, a controller to receive the output signal from the first switch and send a control signal to a vehicle device associated with the switch, the control signal to cause the vehicle device to adjust operation based on the selected value.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. It will be appreciated by a person skilled in the art that an apparatus may embody any one or more of the features contained herein and that the features may be used in any particular combination or sub-combination. Modifications and substitutions by one of ordinary skill in the art are considered to be within the scope of the present disclosure, which is not to be limited except by the claims.

What is claimed is:

1. A switch device, the switch device comprising:
   an engagement surface with a touch sensor to detect a pointer of a user within operable proximity, the touch sensor includes a plurality of detectable locations that extend linearly on the engagement surface, in a direction along a longitudinal length of the switch device, wherein said engagement surface with said touch sensor includes one or more physical features comprising a raised projection on said engagement surface and configured to inform the user as to a setting of said touch sensor;
   a switch defined by the engagement surface, the switch configured to detect force supplied by a user and actuate the switch device; and
   a controller to receive signals from the touch sensor, each signal from the touch sensor based on a respective position of the pointer of the user being detected proximate thereto and including a representation of a detectable location of the plurality of detectable locations, respectively, and in response to actuation of the switch, output a control signal based on the representation the detectable location, respectively.

2. The switch device of claim 1, wherein the switch comprises a mechanical rocker switch.

3. The switch device of claim 1, wherein the switch comprises a pressure sensor.

4. The switch device of claim 1, wherein the touch sensor comprises one or more of a resistive and/or capacitive sensor.

5. The switch device of claim 1, wherein the touch sensor comprises an array of resistive and/or capacitive sensors.

6. The switch device of claim 1, further comprising a haptic feedback device.

7. The switch device of claim 1 wherein said one or more physical features comprises a depression on said engagement surface.

8. The switch device of claim 1 wherein said switch device is positioned in a vehicle having a horizontal plane and said switch device engagement surface is disposed at an angle of 90°+/−30° with respect to said horizontal plane of the vehicle.

9. The switch device of claim 1 wherein said switch device includes a bezel and said bezel includes said touch sensor.

10. A switch assembly for use in a vehicle to control operation one or more vehicle devices, the switch assembly comprising:
    a first switch implemented as a pull-to-close switch, comprising:
        an engagement surface for receiving user input;
        a touch sensor disposed on the engagement surface having a plurality of locations to detect user input, the plurality of locations extending linearly on the engagement surface in a direction along a longitudinal length of the switch device, each location of the plurality of locations corresponding to a different target value within a range of predefined minimum and maximum target values, respectively;
        a switch device coupled to the engagement surface, the switch device to detect a user-supplied force input and cause the first switch to output a signal in response thereto, the signal including a representation of a selected value, the selected value being in said range of the predefined minimum and maximum target values based on a detected position of said user-supplied force input;
        a controller to receive the output signal from the first switch and send a control signal to a vehicle device associated with the first switch, the control signal to cause the vehicle device to adjust operation based on the selected value.

11. The switch assembly of claim 10, wherein the switch device of the first switch comprises a mechanical rocker switch.

12. The switch assembly of claim 10, wherein the switch device of the first switch comprises a pressure sensor.

13. The switch assembly of claim 10, wherein the vehicle device comprises a window controller, and wherein the control signal causes the window controller to transition position to the selected value without further user action.

14. The switch assembly of claim 10, further comprising a second switch, the second switch having an engagement surface that extends substantially transverse with the touch sensor of the vehicle device.

15. The switch assembly of claim 10, wherein the controller is further configured to send the control signal in response to actuation of the second switch, the control signal including a representation of the selected value received via the output signal from the first switch.

16. The switch assembly of claim 10, wherein said engagement surface with said touch sensor includes one or more physical features which features inform the user as to a setting of said touch sensor.

17. The switch assembly of claim 16 wherein said one or more physical features comprises a raised projection on said engagement surface.

18. The switch assembly of claim 16 wherein said one or more physical features comprises a depression on said engagement surface.

19. The switch assembly of claim 10 wherein said switch assembly is positioned in a vehicle having a horizontal plane and said switch assembly engagement surface is disposed at an angle of 90°+/−30° with respect to said horizontal plane of the vehicle.

20. A switch assembly for use in a vehicle to control operation one or more vehicle devices, the switch assembly comprising:
a first switch comprising:
an engagement surface for receiving user input;
a touch sensor disposed on the engagement surface having,
a plurality of locations to detect user input, the plurality of locations extending linearly on the engagement surface in a direction along a longitudinal length of the switch device, each location of the plurality of locations corresponding to a different target value within a range of predefined minimum and maximum target values, respectively wherein said engagement surface with said touch sensor includes one or more physical features which features inform the user as to a setting of said touch sensor wherein one or more of said physical features comprises a raised projection on said engagement surface;
a switch device coupled to the engagement surface, the switch device to detect a user-supplied force input and cause the first switch to output a signal in response thereto, the signal including a representation of a selected value, the selected value being in said range of the predefined minimum and maximum target values based on a detected position of said user-supplied force input; and
a controller to receive the output signal from the first switch and send a control signal to a vehicle device associated with the first switch, the control signal to cause the vehicle device to adjust operation based on the selected value.

21. The switch assembly of claim 20, wherein the switch device of the first switch comprises a mechanical rocker switch.

22. The switch assembly of claim 20, wherein the switch device of the first switch comprises a pressure sensor.

23. The switch assembly of claim 20, wherein the vehicle device comprises a window controller, and wherein the control signal causes the window controller to transition position to the selected value without further user action.

24. The switch assembly of claim 20, further comprising a second switch, the second switch having an engagement surface that extends substantially transverse with the touch sensor of the vehicle device.

25. The switch assembly of claim 20, wherein the controller is further configured to send the control signal in response to actuation of the second switch, the control signal including a representation of the selected value received via the output signal from the first switch.

26. The switch assembly of claim 20 wherein said switch assembly is positioned in a vehicle having a horizontal plane and said switch assembly engagement surface is disposed at an angle of 90°+/−30° with respect to said horizontal plane of the vehicle.

* * * * *